US012573992B2

(12) United States Patent
     Ho

(10) Patent No.:    US 12,573,992 B2
(45) Date of Patent:        Mar. 10, 2026

(54) DIFFERENTIAL AMPLIFIER CIRCUIT

(71) Applicant: ASMedia Technology Inc., New Taipei City (TW)

(72) Inventor: Chieh-Jui Ho, New Tapiei City (TW)

(73) Assignee: ASMedia Technology Inc., New Taipei City (TW)

( * ) Notice: Subject to any disclaimer, the term of this patent is extended or adjusted under 35 U.S.C. 154(b) by 574 days.

(21) Appl. No.: 18/088,618

(22) Filed: Dec. 26, 2022

(65) Prior Publication Data

US 2024/0154589 A1      May 9, 2024

(30) Foreign Application Priority Data

Nov. 4, 2022    (TW) .................................. 111142294

(51) Int. Cl.
     *H03F 3/45*          (2006.01)
     *H03F 1/08*          (2006.01)
     *H03F 1/56*          (2006.01)

(52) U.S. Cl.
     CPC ......... *H03F 3/45179* (2013.01); *H03F 1/086* (2013.01); *H03F 1/565* (2013.01)

(58) Field of Classification Search
     USPC .................................. 330/304, 305, 252–261
     See application file for complete search history.

(56) References Cited

U.S. PATENT DOCUMENTS

| | | | | |
|---|---|---|---|---|
| 7,049,888 B2 * | 5/2006 | Soda | ................... | H03F 3/45381 |
| | | | | 330/253 |
| 9,312,819 B1 * | 4/2016 | Chen | ...................... | H03H 11/48 |
| 9,755,599 B2 * | 9/2017 | Yuan | ................... | H04L 25/0264 |
| 10,236,851 B2 | 3/2019 | Tsai | | |
| 11,381,208 B1 * | 7/2022 | Tam | ..................... | H03G 1/0029 |
| 2011/0063024 A1 * | 3/2011 | Kucharski | .............. | H03H 11/48 |
| | | | | 327/581 |
| 2019/0081604 A1 * | 3/2019 | Thiagarajan | .......... | H03F 3/4565 |
| 2022/0209729 A1 | 6/2022 | Lim et al. | | |
| 2023/0064147 A1 * | 3/2023 | Cho | .......................... | G05F 1/56 |

FOREIGN PATENT DOCUMENTS

| | | |
|---|---|---|
| CN | 112311708 | 2/2021 |
| TW | I556573 | 11/2016 |

* cited by examiner

*Primary Examiner* — Andrea Lindgren Baltzell
*Assistant Examiner* — Nareh Shamiryan
(74) *Attorney, Agent, or Firm* — JCIPRNET

(57)                    ABSTRACT

A differential amplifier circuit is provided. The differential amplifier circuit includes a differential amplifier, a first active inductor, a second active inductor, and a parameter circuit. The differential amplifier includes a first differential output terminal and a second differential output terminal. The first active inductor is coupled to the first differential output terminal. The second active inductor is coupled to the second differential output terminal. The parameter circuit is coupled between the first active inductor and the second active inductor. The parameter circuit provides at least one parameter. A low frequency gain, an equivalent impedance, and a bandwidth of the differential amplifier circuit are adjusted in response to the at least one parameter.

7 Claims, 6 Drawing Sheets

200

DIFFERENTIAL AMPLIFIER CIRCUIT

CROSS-REFERENCE TO RELATED APPLICATION

This application claims the priority benefit of Taiwan application serial no. 111142294, filed on Nov. 4, 2022. The entirety of the above-mentioned patent application is hereby incorporated by reference herein and made a part of this specification.

BACKGROUND

Technical Field

The disclosure relates to an amplifier circuit, and more particularly, to a differential amplifier circuit.

Description of Related Art

Amplifier circuits have different impedance and different bandwidth requirements under different operating frequencies. Therefore, conventional amplifier circuits may be equipped with active inductors to increase the impedance of the amplifier circuit at high frequency. However, the active inductor is unable to adjust the gain, the equivalent impedance, and the bandwidth according to different operation frequencies. Therefore, how to provide an amplifier circuit with flexible adjustment functions of gain, equivalent impedance, and bandwidth is one of the research focuses of those skilled in the art.

SUMMARY

The disclosure provides a differential amplifier circuit with flexible adjustment functions of gain, equivalent impedance, and bandwidth.

The differential amplifier circuit of the disclosure includes a differential amplifier, a first active inductor, a second active inductor, and a parameter circuit. The differential amplifier includes a first differential output terminal and a second differential output terminal. The first active inductor is coupled to the first differential output terminal. The second active inductor is coupled to the second differential output terminal. The parameter circuit is coupled between the first active inductor and the second active inductor. The parameter circuit provides at least one parameter. A low frequency gain, an equivalent impedance, and a bandwidth of the differential amplifier circuit are adjusted in response to the at least one parameter.

Based on the above, the parameter circuit is coupled between the first active inductor and the second active inductor. The parameter circuit provides parameters located between the first active inductor and the second active inductor. A low frequency gain, an equivalent impedance, and a bandwidth of the differential amplifier circuit are adjusted in response to the at least one parameter. Thus, the differential amplifier circuit of disclosure has flexible adjustment functions of gain, equivalent impedance, and bandwidth.

In order to make the above-mentioned features and advantages of the disclosure comprehensible, embodiments accompanied with drawings are described in detail below.

DESCRIPTION OF THE EMBODIMENTS

Figure 1:
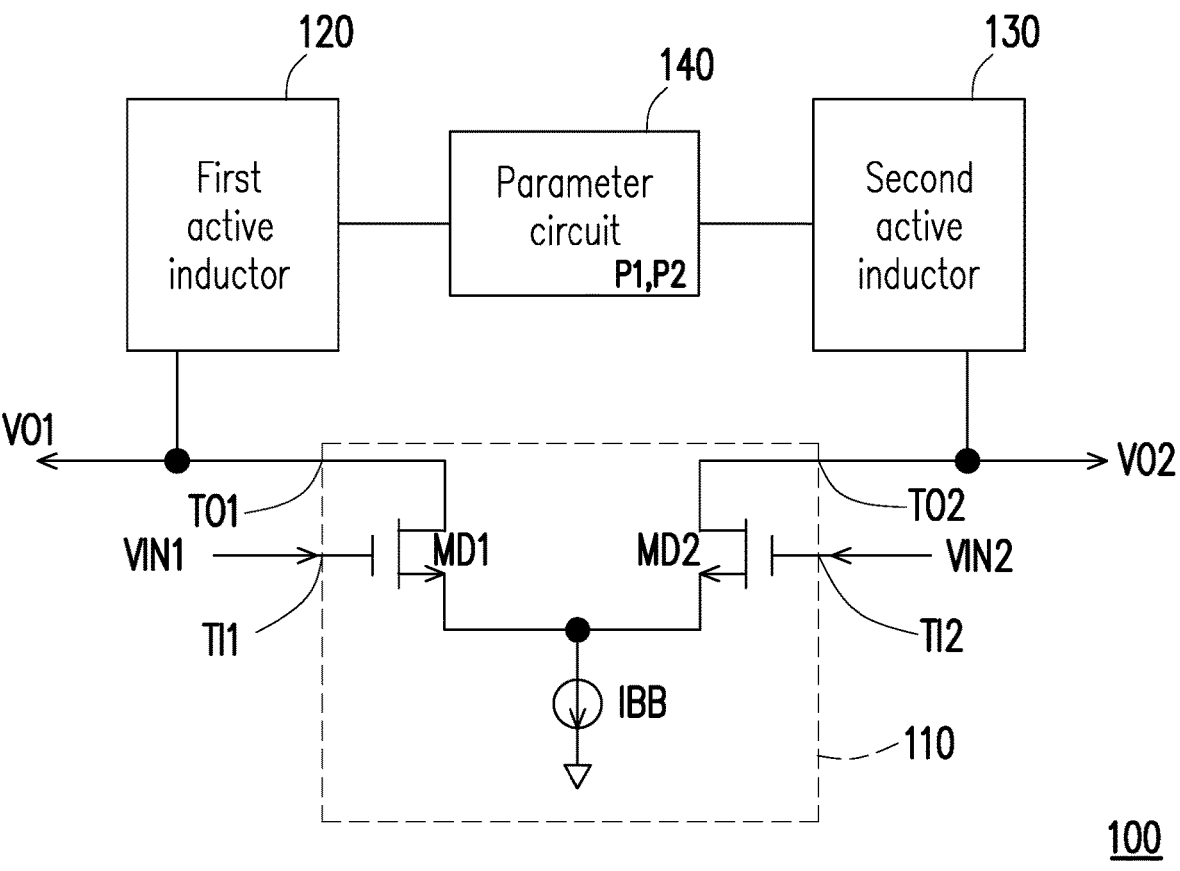
FIG. 1 is a schematic view of a differential amplifier circuit according to the first embodiment of the disclosure.

Some embodiments of the disclosure accompanied with the drawings will now be described in detail. In the reference numerals recited in description below, the same reference numerals shown in different drawings are regarded as the same or similar elements. These examples are only a portion of the disclosure and do not disclose all possible embodiments of the disclosure. More precisely, these embodiments are only examples within the scope of the patent application of the disclosure.

FIG. 1 is a schematic view of a differential amplifier circuit according to the first embodiment of the disclosure. Referring to FIG. 1, in this embodiment, a differential amplifier circuit 100 includes a differential amplifier 110, a first active inductor 120, a second active inductor 130, and a parameter circuit 140. The differential amplifier 110 includes a differential input terminal TI1, a differential input terminal TI2, a differential output terminal TO1, and a differential output terminal TO2. The differential amplifier 110 receives a differential input signal VIN1 through the differential input terminal TI1. The differential amplifier 110 receives a differential input signal VIN2 through the differential input terminal TI2. The differential amplifier 110 outputs a differential output signal VO1 through the differential output terminal TO1 and a differential output signal VO2 through the differential output terminal TO2.

In this embodiment, the first active inductor 120 is coupled to the first differential output terminal TO1. The second active inductor 130 is coupled to the second differential output terminal TO2. The parameter circuit 140 is coupled between the first active inductor 120 and the second active inductor 130. The parameter circuit 140 provides at least one of parameter P1 and parameter P2. A low frequency gain, an equivalent impedance, and a bandwidth of the differential amplifier circuit 100 are adjusted in response to at least one of the parameters P1 and P2.

For example, the parameter P1 may be a resistance. The parameter P2 may be capacitance. The equivalent impedance of the differential amplifier circuit 100 is positively correlated with the parameter P1 (i.e., resistance). The low frequency gain of the differential amplifier circuit 100 is negatively correlated with the parameter P1. The parameter P1 is located between the first active inductor 120 and the second active inductor 130. The bandwidth of the differential amplifier circuit 100 is positively correlated with the parameter P1 (i.e., resistance).

In light of the above, the parameter P1 and the parameter P2 located between the first active inductor 120 and the second active inductor 130 may be used to adjust the low frequency gain, the equivalent impedance, and the bandwidth of the differential amplifier circuit 100. In this way, the low frequency gain, the equivalent impedance, and the bandwidth of the differential amplifier circuit 100 is flexibly adjusted.

In this embodiment, the differential amplifier 110 further includes a transistor MD1, a transistor MD2, and a current source IBB. The disclosure is not limited to the implementation of the differential amplifier 110. A first end of the transistor MD1 is coupled to the differential output terminal TO1. A control end of the transistor MD1 is coupled to the differential input terminal TI1. A first end of the transistor MD2 is coupled to the differential output terminal TO2. A control end of the transistor MD2 is coupled to the differential input terminal TI2. A first end of the current source IBB is coupled to a second end of the transistor MD1 and a second end of transistor MD2. A second end of the current source IBB is coupled to a reference low voltage (i.e., ground). The current source IBB is configured to provide bias current.

Taking this embodiment as an example, the transistor MD1 and the transistor MD2 are respectively implemented with N-type field-effect transistors (FETs). The transistor MD1 and the transistor MD2 of this embodiment are respectively implemented with N-type metal-oxide-semiconductor field-effect transistors (MOSFETs). In some embodiments, the transistor MD1 and the transistor MD2 are respectively implemented with NPN bipolar transistors (BJT).

Figure 2:
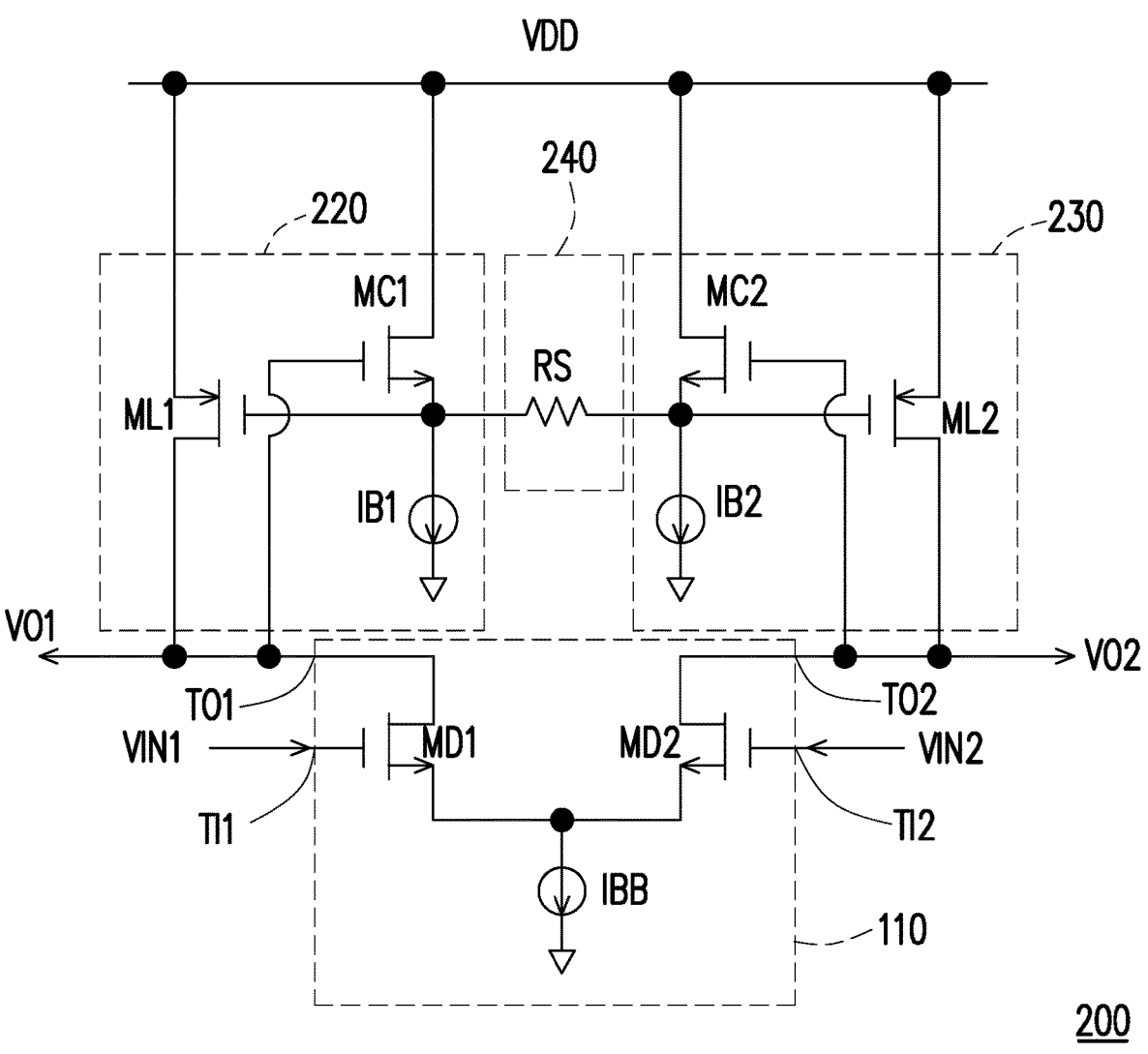
FIG. 2 is a schematic view of a differential amplifier circuit according to the second embodiment of the disclosure.

FIG. 2 is a schematic view of a differential amplifier circuit according to the second embodiment of the disclosure. Referring to FIG. 2, in this embodiment, a differential amplifier circuit 200 includes the differential amplifier 110, a first active inductor 220, a second active inductor 230, and a parameter circuit 240. The implementation of the differential amplifier 110 has been clearly described in the embodiment of FIG. 1, and thus is not repeated herein. The first active inductor 220 includes a control transistor MC1, a load transistor ML1, and a current source IB1. A first end of the control transistor MC1 is coupled to a reference high voltage VDD. A control end of the control transistor MC1 is coupled to the differential output terminal TO1. A first end of the load transistor ML1 is coupled to a reference high voltage. A second end of the load transistor ML1 is coupled to the differential output terminal TO1. A control end of the load transistor ML1 is coupled to a second end of the control transistor MC1. The current source IB1 is coupled between the second end of the control transistor MC1 and the reference low voltage.

The second active inductor 230 includes a control transistor MC2, a load transistor ML2, and a current source IB2. A first end of the control transistor MC2 is coupled to the reference high voltage VDD. A control end of the control transistor MC2 is coupled to the differential output terminal TO2. A first end of the load transistor ML2 is coupled to the reference high voltage VDD. A second end of the load transistor ML2 is coupled to the differential output terminal TO2. A control end of the load transistor ML2 is coupled to a second end of the control transistor MC2. The current source IB2 is coupled between the second end of the control transistor MC2 and the reference low voltage.

In response to the differential amplifier circuit 200 operating at a low frequency (less than a set frequency of the differential amplifier circuit 200), the control transistor MC1 operates based on a frequency of the differential output signal VO1. Thus, the load transistor ML1 also operates based on the frequency of the differential output signal VO1. At low frequencies, the load transistor ML1 provides an impedance associated with the frequency of the differential output signal VO1. Similarly, in response to the differential amplifier circuit 200 operating at a low frequency (less than the set frequency of the differential amplifier circuit 200), the load transistor ML2 provides an impedance associated with a frequency of the differential output signal VO2.

In response to the differential amplifier circuit 200 operating close to the set frequency, a parasitic capacitance is provided inside the load transistor ML1. The voltage at the control end of the load transistor ML1 is at a higher level due to the parasitic capacitance inside the load transistor ML1. Thus, the load transistor ML1 provides a higher impedance. Similarly, in response to the differential amplifier circuit 200 operating close to the set frequency, the load transistor ML2 also provides a higher impedance.

In this embodiment, the parameter circuit 240 includes a resistor RS. The resistor RS is coupled between the second end of the control transistor MC1 and the second end of the control transistor MC2. The resistor RS provides a resistance (the parameter P1 of the first embodiment). In this embodiment, the resistor RS may be implemented with a variable resistor or a fixed resistor.

In this embodiment, the control transistor MC1 and the control transistor MC2 are respectively implemented with N-type FETs. The control transistor MC1 and the control transistor MC2 of this embodiment are respectively implemented with N-type MOSFETs. In some embodiments, the control transistor MC1 and the control transistor MC2 are respectively implemented with NPN type BJT. The load transistor ML1 and the load transistor ML2 are respectively implemented with P-type FETs. The load transistor ML1 and the load transistor ML2 of this embodiment are respectively implemented with P-type MOSFETs. In some embodiments, the load transistor ML1 and the load transistor ML2 are respectively implemented with PNP type BJT.

Figure 3:
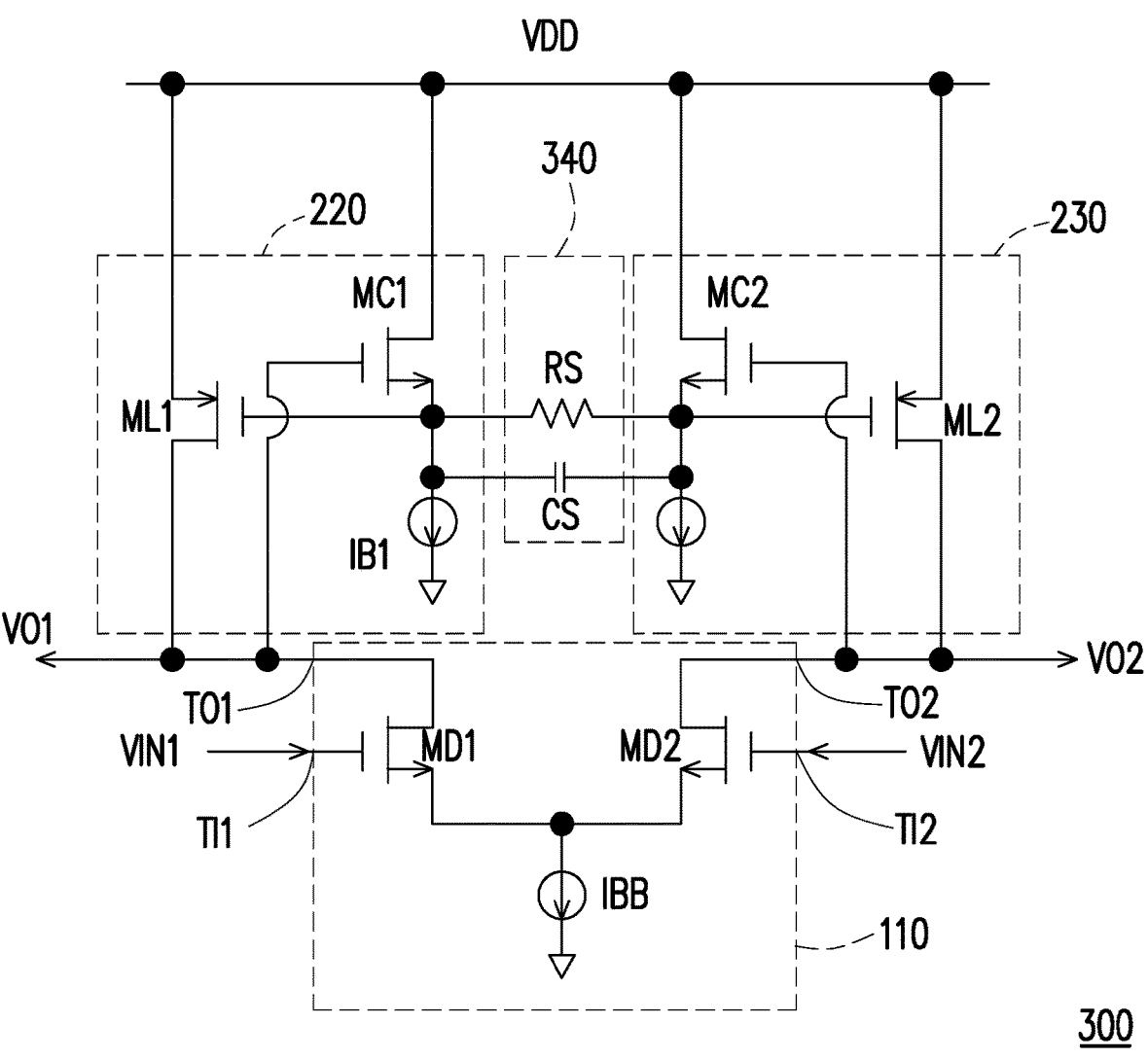
FIG. 3 is a schematic view of a differential amplifier circuit according to the third embodiment of the disclosure.

FIG. 3 is a schematic view of a differential amplifier circuit according to the third embodiment of the disclosure. Referring to FIG. 3, in this embodiment, a differential amplifier circuit 300 includes the differential amplifier 110, the first active inductor 220, the second active inductor 230, and a parameter circuit 340. The implementation of the differential amplifier 110 has been clearly described in the embodiment of FIG. 1, and thus is not repeated herein. The implementations of the first active inductor 220 and the second active inductor 230 have been clearly described in the embodiment of FIG. 2, and thus are not repeated herein.

The parameter circuit 340 includes a resistor RS and a capacitor CS. The resistor RS is coupled between the second end of the control transistor MC1 and the second end of the control transistor MC2. The resistor RS provides a resistance (the parameter P1 of the first embodiment). The capacitor CS is coupled between the second end of the control transistor MC1 and the second end of the control transistor MC2. The capacitor CS provides a capacitance (the parameter P2 of the first embodiment). In this embodiment, the resistor RS may be implemented with a variable resistor or a fixed resistor. The capacitor CS may be implemented with a variable capacitor, a varactor, or a fixed capacitor. In this embodiment, the set frequency of the differential amplifier circuit 300 may be determined by the resistance of the resistor RS and the capacitance of the capacitor CS. In other words, the parameter circuit 340 of this embodiment may be a resonant tank.

In some embodiments, the capacitor CS is coupled between the first end of the control transistor MC1 and the first end of the control transistor MC2.

Figure 4:
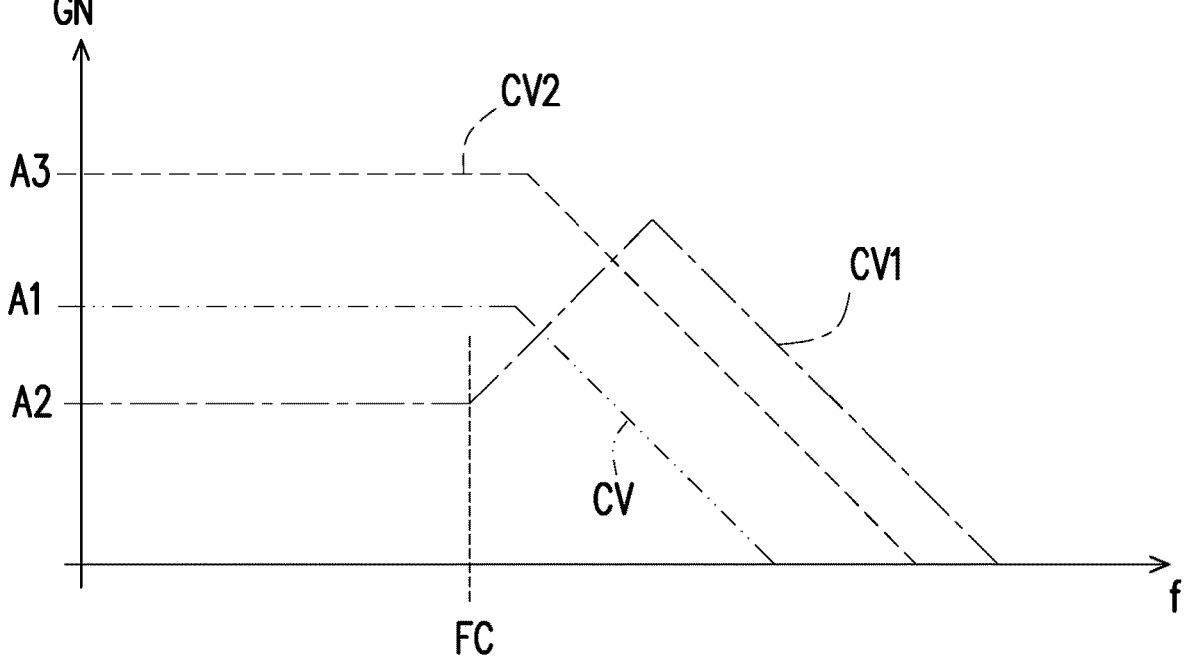
FIG. 4 is a schematic view of gain according to an embodiment of the disclosure.

Referring to FIG. 3 and FIG. 4, FIG. 4 is a schematic view of gain according to an embodiment of the disclosure. A gain curve CV, a gain curve CV1, and a gain curve CV2 are shown in FIG. 4. In this embodiment, the gain curve CV is a differential amplifier circuit without an active inductor.

The gain curve CV has a gain A1. In response to a high frequency, the gain A1 of the gain curve CV decreases.

The gain curve CV1 is a first gain curve of the differential amplifier circuit 300 of this embodiment. In this embodiment, the differential amplifier circuit 300 is equipped with the first active inductor 220 and the second active inductor 230. Therefore, in response to the frequency being higher than a corner frequency FC, the gain is increased. In this embodiment, in response to the resistance of the resistor RS being increased, a low frequency gain A2 is decreased. The decreased low frequency gain A2 provides a low frequency wave effect. In addition, the gain when the frequency is higher than the corner frequency FC is highlighted. Therefore, the increase in resistance of resistor RS provides equivalent compensation for high frequency. In addition, in response to the capacitance of the capacitor CS being increased, a gain turning point of the gain curve CV1 shifts towards low frequency. Therefore, the bandwidth is increased. In response to the capacitance of the capacitor CS being decreased, the gain turning point of the gain curve CV1 shifts toward high frequency. Therefore, the bandwidth is decreased. In other words, the high frequency gain bandwidth of the gain curve CV1 is positively correlated with the capacitance of the capacitor CS.

The gain curve CV2 is a second gain curve of the differential amplifier circuit 300 of this embodiment. In this embodiment, in response to the resistance of the resistor RS being decreased, the low frequency gain A2 is increased to a low frequency gain A3, thus forming the gain curve CV2. In other words, the high frequency gain bandwidth of the gain curve CV1 is positively correlated with the capacitance of the capacitor CS. The low frequency gain of the differential amplifier circuit 300 is negatively correlated with the resistance of the resistor RS.

It should be noted that through the adjustment of the resistance of the resistor RS and the capacitance of the capacitor CS, the gain and the bandwidth of the differential amplifier circuit 300 may be significantly changed at different frequencies. Therefore, the differential amplifier circuit 300 has flexible adjustment functions of gain, equivalent impedance, and bandwidth.

It should be understood that the differential amplifier circuit 200 shown in FIG. 2 may also realize gain conversion between the low frequency gain A2 and the low frequency gain A3.

Figure 5:
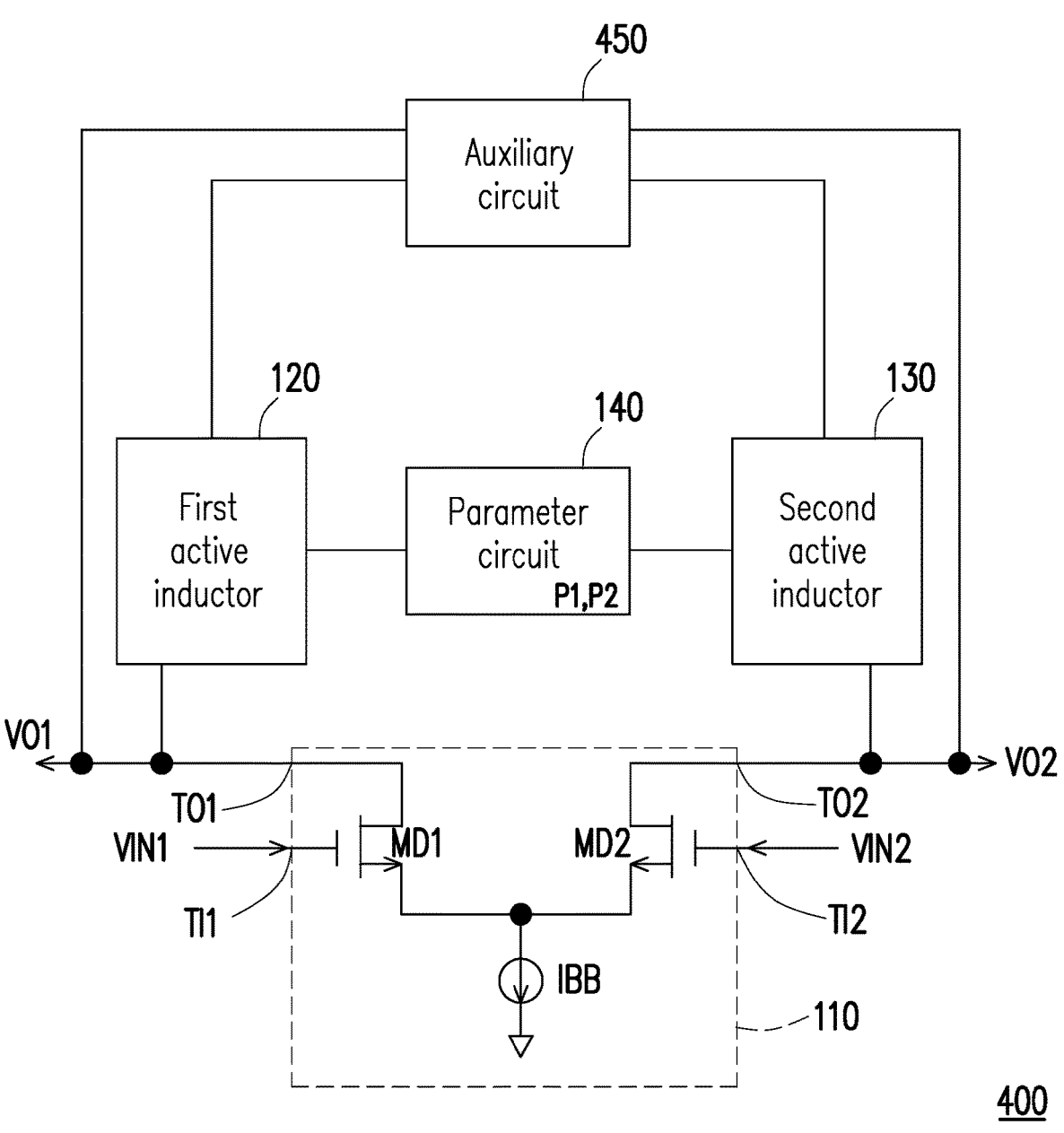
FIG. 5 is a schematic view of a differential amplifier circuit according to the fourth embodiment of the disclosure.

FIG. 5 is a schematic view of a differential amplifier circuit according to the fourth embodiment of the disclosure. Referring to FIG. 5, in this embodiment, a differential amplifier circuit 400 includes the differential amplifier 110, the first active inductor 120, the second active inductor 130, the parameter circuit 140, and an auxiliary circuit 450. The implementations of the differential amplifier 110, the first active inductor 120, the second active inductor 130, and the parameter circuit 140 have been clearly described at least in the embodiment of FIG. 1, and thus are not repeated herein. In this embodiment, the auxiliary circuit 450 is coupled between the first active inductor 120 and the second active inductor 130. In response to a frequency of a differential output signal VO1 located in the differential output terminal TO1 and a frequency of a differential output signal VO2 located in the differential output terminal TO2 being higher than the set frequency, the auxiliary circuit 450 gains the differential output signal VO1 and the differential output signal VO2.

Figure 6:
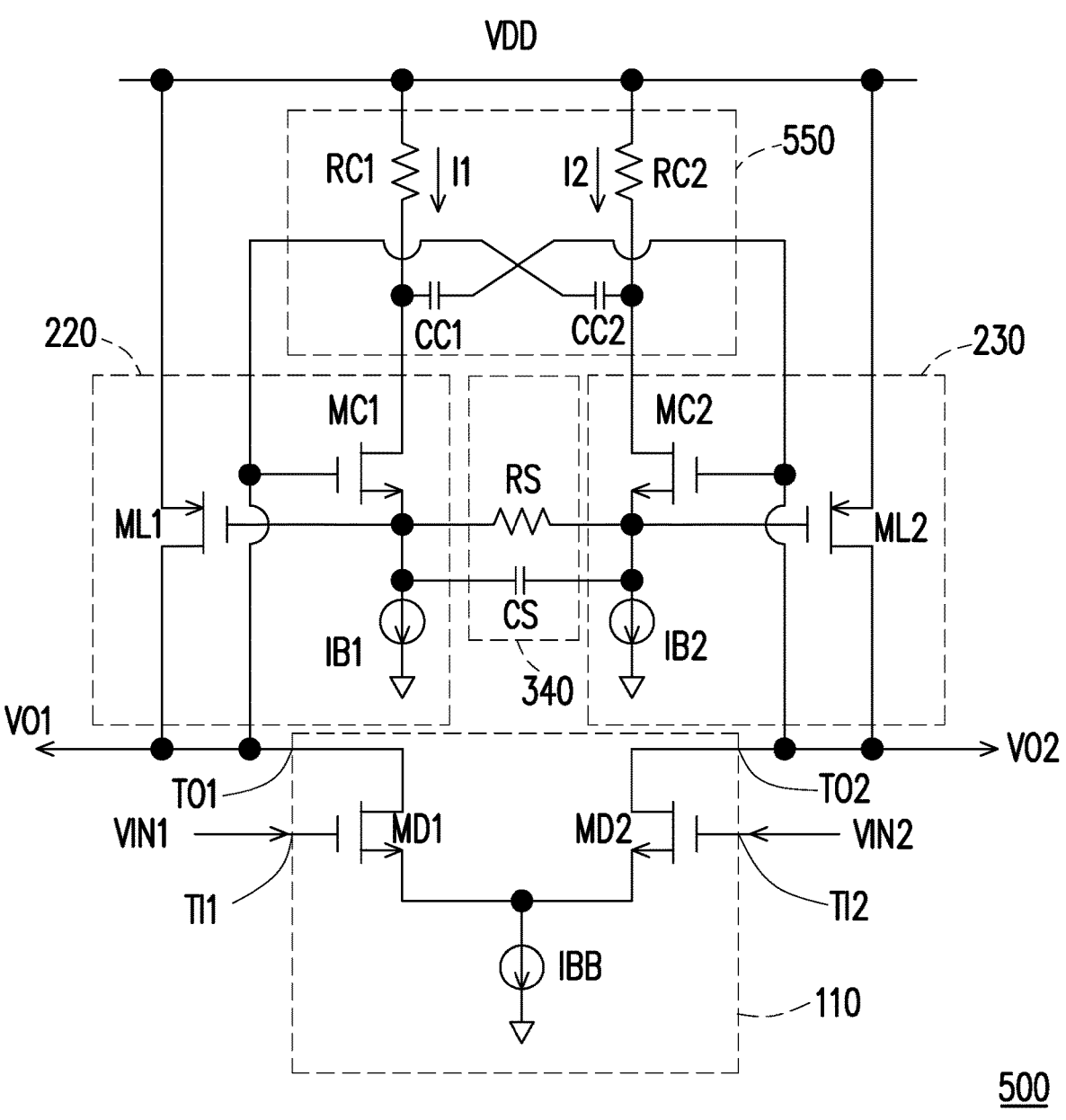
FIG. 6 is a schematic view of a differential amplifier circuit according to the fifth embodiment of the disclosure.

FIG. 6 is a schematic view of a differential amplifier circuit according to the fifth embodiment of the disclosure. Referring to FIG. 6, in this embodiment, a differential amplifier circuit 500 includes the differential amplifier 110, the first active inductor 220, the second active inductor 230, the parameter circuit 340, and an auxiliary circuit 550. The implementations of the differential amplifier 110, the first active inductor 220, the second active inductor 230, and the parameter circuit 340 have been clearly described in the embodiments of FIG. 1 to FIG. 4, and thus are not repeated herein. In this embodiment, the auxiliary circuit includes an auxiliary resistor RC1, an auxiliary resistor RC2, an auxiliary capacitor CC1, and an auxiliary capacitor CC2. The auxiliary resistor RC1 is coupled between the reference high voltage VDD and the first end of the control transistor MC1. The auxiliary resistor RC2 is coupled between the reference high voltage VDD and the first end of the control transistor MC2. The auxiliary capacitor CC1 is coupled between the first end of the control transistor MC1 and the control end of the control transistor MC2. The auxiliary capacitor CC2 is coupled between the first end of the control transistor MC2 and the control end of the control transistor MC1.

In this embodiment, in response to the frequencies of the differential output signal VO1 and the differential output signal VO2 being higher than the set frequency, the impedances of the auxiliary capacitor CC1 and the auxiliary capacitor CC2 are decreased. The auxiliary capacitor CC1 transmits at least a part of an electric current I1 flowing through the auxiliary resistor RC1 (an electric current flowing through the auxiliary capacitor CC1) to the differential output terminal TO2. Thus, the differential output signal VO2 is be gained by the electric current flowing through the auxiliary capacitor CC1. Similarly, the auxiliary capacitor CC2 transmits at least a part of an electric current I2 flowing through the auxiliary resistor RC2 (an electric current flowing through the auxiliary capacitor CC2) to the differential output terminal TO1. Thus, the differential output signal VO1 is gained by the electric current flowing through the auxiliary capacitor CC2. In light of the above, in response to the frequency of the differential output signal VO1 located in the differential output terminal TO1 and the frequency of the differential output signal VO2 located in the differential output terminal TO2 being higher than the set frequency, the auxiliary circuit 550 automatically increases the high frequency gain of the differential amplifier circuit 500.

In some embodiments, the parameter circuit 340 may be replaced with the parameter circuit 240 shown in FIG. 2.

To sum up, a differential amplifier circuit includes a differential amplifier, a first active inductor, a second active inductor, and a parameter circuit. The parameter circuit is coupled between the first active inductor and the second active inductor. The parameter circuit provides parameters located between the first active inductor and the second active inductor. A low frequency gain, an equivalent impedance, and a bandwidth of the differential amplifier circuit are adjusted in response to the at least one parameter. In this way, the differential amplifier circuit of the disclosure has flexible adjustment functions of gain, equivalent impedance, and bandwidth. In addition, in some embodiments, the differential amplifier circuit also includes an auxiliary circuit. The auxiliary circuit increases the high frequency gain of the differential amplifier circuit.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

7

1. A differential amplifier circuit, comprising:
a differential amplifier, comprising a first differential output terminal and a second differential output terminal;
a first active inductor, coupled to the first differential output terminal;
a second active inductor, coupled to the second differential output terminal; and
a parameter circuit, coupled between the first active inductor and the second active inductor and configured to provide at least one parameter, wherein a low frequency gain, an equivalent impedance, and a bandwidth of the differential amplifier circuit are adjusted in response to the at least one parameter,
wherein the parameter circuit comprises a resistor, coupled between the first active inductor and the second active inductor and configured to provide a resistance of the at least one parameter to adjust the low frequency gain and the equivalent impedance of the differential amplifier circuit,
wherein the first active inductor comprises:
a first control transistor, wherein a first end of the first control transistor is coupled to a reference high voltage, and a control end of the first control transistor is coupled to the first differential output terminal:
a first load transistor, wherein a first end of the first load transistor is coupled to the reference high voltage, a second end of the first load transistor is coupled to the first differential output terminal, and a control end of the first load transistor is coupled to a second end of the first control transistor; and
a first current source, coupled between the second end of the first control transistor and a reference low voltage,
wherein the second active inductor comprises:
a second control transistor, wherein a first end of the second control transistor is coupled to the reference high voltage, and a control end of the second control transistor is coupled to the second differential output terminal;
a second load transistor, wherein a first end of the second load transistor is coupled to the reference high voltage, a second end of the second load transistor is coupled to the second differential output terminal, and a control end of the second load transistor is coupled to a second end of the second control transistor; and
a second current source, coupled between the second end of the second control transistor and the reference low voltage,
wherein the parameter circuit comprises:
the resistor coupled between the second end of the first control transistor and the second end of the second control transistor.

2. The differential amplifier circuit according to claim 1, wherein:
the equivalent impedance is positively correlated with the resistance, and
the low frequency gain is negatively correlated with the resistance.
3. The differential amplifier circuit according to claim 2, wherein:
the at least one parameter further comprises a capacitance, and
the bandwidth is positively correlated with the capacitance.
4. The differential amplifier circuit according to claim 1, wherein the parameter circuit further comprises:
a capacitor, coupled between the second end of the first control transistor and the second end of the second control transistor and configured to provide a capacitance of the at least one parameter.
5. The differential amplifier circuit according to claim 1, further comprising:
an auxiliary circuit, coupled between the first active inductor and the second active inductor,
wherein in response to a frequency of a first differential output signal located in the first differential output terminal and a frequency of a second differential output signal located in the second differential output terminal being higher than a set frequency, the auxiliary circuit increases a gain of the first differential output signal and the second differential output signal.
6. The differential amplifier circuit according to claim 5, wherein the auxiliary circuit comprises:
a first auxiliary resistor, coupled between the reference high voltage and the first end of the first control transistor;
a second auxiliary resistor, coupled between the reference high voltage and the first end of the second control transistor;
a first auxiliary capacitor, coupled between the first end of the first control transistor and the control end of the second control transistor; and
a second auxiliary capacitor, coupled between the first end of the second control transistor and the control end of the first control transistor.
7. The differential amplifier circuit according to claim 6, wherein in response to the frequency of the first differential output signal and the frequency of the second differential output signal being higher than the set frequency, the first auxiliary capacitor transmits at least a part of an electric current flowing through the first auxiliary resistor to the second differential output terminal, and the second auxiliary capacitor transmits at least a part of an electric current flowing through the second auxiliary resistor to the first differential output terminal.

* * * * *